US012745555B2

(12) United States Patent
Mizusaki

(10) Patent No.: US 12,745,555 B2
(45) Date of Patent: Sep. 22, 2026

(54) DISPLAY ELEMENT

(71) Applicant: SHARP KABUSHIKI KAISHA, Sakai City (JP)

(72) Inventor: Masanobu Mizusaki, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 859 days.

(21) Appl. No.: 18/027,060

(22) PCT Filed: Sep. 24, 2020

(86) PCT No.: PCT/JP2020/035931
§ 371 (c)(1),
(2) Date: Mar. 17, 2023

(87) PCT Pub. No.: WO2022/064584
PCT Pub. Date: Mar. 31, 2022

(65) Prior Publication Data

US 2023/0329088 A1 Oct. 12, 2023

(51) Int. Cl.

| | |
|---|---|
| ***H10K 85/10*** | (2023.01) |
| ***C09K 11/06*** | (2006.01) |
| ***H10K 59/80*** | (2023.01) |
| ***H10K 85/40*** | (2023.01) |

(52) U.S. Cl.
CPC ............ *H10K 85/141* (2023.02); *C09K 11/06* (2013.01); *H10K 85/111* (2023.02); *H10K 85/40* (2023.02); *C09K 2211/1011* (2013.01); *H10K 59/873* (2023.02)

(58) Field of Classification Search
CPC ............................ H10K 85/40; H10K 85/141
See application file for complete search history.

(56) References Cited

U.S. PATENT DOCUMENTS

2018/0248122 A1* 8/2018 Otsuki ................ H10K 71/135

FOREIGN PATENT DOCUMENTS

| | | |
|---|---|---|
| JP | 2008016336 A | 1/2008 |
| JP | 2012015338 A | 1/2012 |
| JP | 2019082598 A | 5/2019 |
| WO | 2012086742 A1 | 6/2012 |
| WO | 2017033828 A1 | 3/2017 |
| WO | 2019181592 A1 | 9/2019 |

* cited by examiner

*Primary Examiner* — Vu A Nguyen
(74) *Attorney, Agent, or Firm* — ScienBiziP, P.C.

(57) ABSTRACT

Provided is a display element having a function layer containing a phenylamine-based compound and a compound having a siloxane skeleton.

20 Claims, 2 Drawing Sheets

| | EQE (%) | CHROMATICITY (x, y) | LIFETIME (H) |
|---|---|---|---|
| EXAMPLE 1-1 | 13.1 | (0.14, 0.05) | 123 |
| EXAMPLE 1-2 | 12.5 | (0.14, 0.05) | 133 |
| EXAMPLE 1-3 | 10.9 | (0.14, 0.05) | 135 |
| EXAMPLE 2-1 | 13.1 | (0.14, 0.05) | 146 |
| EXAMPLE 2-2 | 11.5 | (0.14, 0.05) | 145 |
| EXAMPLE 1-3 | 9.6 | (0.14, 0.05) | 146 |
| EXAMPLE 3-1 | 13.1 | (0.14, 0.05) | 143 |
| EXAMPLE 3-2 | 12.8 | (0.14, 0.05) | 150 |
| EXAMPLE 3-3 | 10.2 | (0.14, 0.05) | 154 |
| COMPARATIVE EXAMPLE 1 | 13.1 | (0.14, 0.05) | 116 |
| COMPARATIVE EXAMPLE 2 | 11.3 | (0.14, 0.06) | 88 |

FIG. 2

DISPLAY ELEMENT

TECHNICAL FIELD

The disclosure relates to a display element.

BACKGROUND ART

For example, PTL 1 discloses a display sealing material that contains a maleimide compound and is used in a display such as a display device.

CITATION LIST

Patent Literature

PTL 1: JP 2019-082598 A

SUMMARY

Technical Problem

However, for example, even when the sealing material is used, the luminance of a display element in a display device or the like decreases over time, and in some cases, the lifetime of the display element may be short. Therefore, a demand exists for improvements in display elements to suppress this decrease in luminance over time and extend the lifetime.

Thus, a main object of the disclosure is to provide a display element with a further improved lifetime.

Solution to Problem

A display element according to one aspect of the disclosure has a function layer containing a phenylamine-based compound and a compound having a siloxane skeleton.

A display element according to another aspect of the disclosure has a function layer containing a polymer having a phenylamine-based skeleton and a siloxane skeleton.

BRIEF DESCRIPTION OF DRAWINGS

FIG. 2 is a table showing evaluation results of display elements of examples and comparative examples.

DESCRIPTION OF EMBODIMENTS

Figure 1:
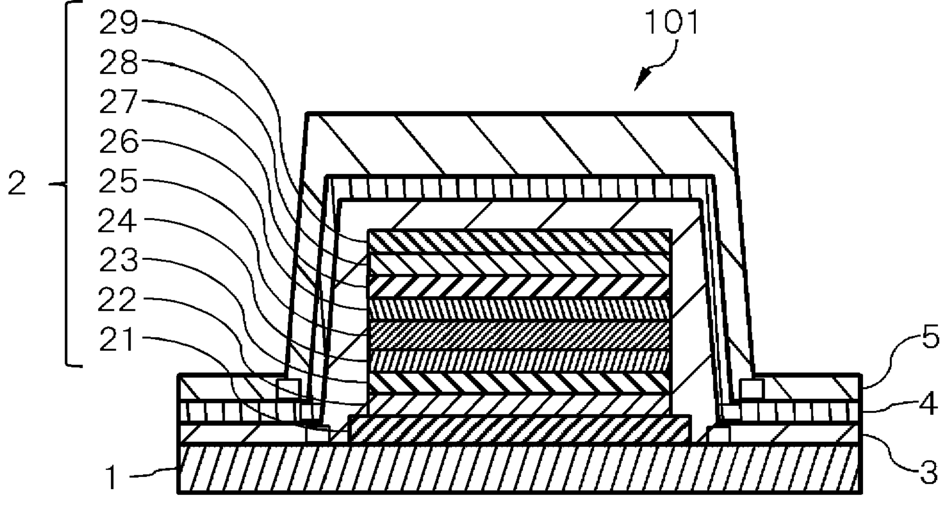
FIG. 1 is an image schematically illustrating an example of a layered structure of a display element according to a first embodiment.

The embodiments described below are merely illustrative of the disclosure. Further, the disclosure is not limited in any way to the following embodiments.

First Embodiment

FIG. 1 is an image schematically illustrating an example of a layered structure of a display element 101 according to the present embodiment.

As illustrated in FIG. 1, in the display element 101, for example, a light-emitting portion 2, a CAP layer 3, a function layer 4, and a TFE layer 5 are provided in this order on a substrate 1. Note that a plurality of display elements 101 are arranged in a matrix shape and configure a display device. The display device is configured such that, for example, the substrate 1 is shared by a plurality of display elements 101, and a plurality of the light-emitting portions 2 and the like are provided on this substrate 1.

The light-emitting portion 2 has a layered structure in which, for example, an anode 21, a hole injection layer 22, a hole transport layer 23, an electron blocking layer 24, a light-emitting layer 25, a hole blocking layer 26, an electron transport layer 27, an electron injection layer 28, and a cathode 29 are provided in this order.

The display element 101 can be manufactured by, for example, laminating each layer on the substrate 1.

The substrate 1 is formed of, for example, glass, polyimide or the like, and functions as a support body that supports each of the layers described above. The substrate may be an array substrate on which a thin film transistor (TFT) and the like are formed, for example.

The anode 21 supplies positive holes to the light-emitting layer 25.

The cathode 29 supplies electrons to the light-emitting layer 25. Further, the cathode 29 is provided so as to oppose the anode 21.

The anode 21 and/or the cathode 29 is formed of a light-transmissive material. Note that the anode 21 and/or the cathode 29 may be formed of a light-reflective material. In a case in which the display element 101 is formed as a top-emitting display element, the cathode 29, which is the upper layer, is formed of a light-transmissive material, and the anode 21, which is the lower layer, is formed of a light-reflective material. Also, in a case in which the display element 101 is a bottom-emitting display element, the cathode 29 that is the upper layer is formed of a light-reflective material, and the anode 21 that is the lower layer is formed of a light-transmissive material. In addition, the anode 21 an/or the cathode 29 may be formed as a layered body including a light-transmissive material and a light-reflective material to form an electrode having light reflectivity.

As the light-transmissive material, a transparent conductive material can be used, for example. Specifically, for example, indium tin oxide (ITO), indium zinc oxide (IZO), tin oxide ($SnO_2$), or fluorine-doped tin oxide (FTO) can be used as the light-transmissive material. These materials have a high transmittance of visible light, and thus luminous efficiency of the display element 101 is improved.

As the light-reflective material, a metal material can be used, for example. Specifically, for example, aluminum (Al), silver (Ag), copper (Cu), or gold (Au) can be used as the light-reflective material. These materials have a high reflectivity of visible light, and thus luminous efficiency is improved.

Note that the anode 21 and the cathode 29 can be formed by various known methods such as, for example, sputtering and vapor deposition.

The light-emitting layer 25 is disposed between the anode 21 and the cathode 29 and emits light. The light-emitting layer 25 includes, for example, a light-emitting material such as an organic light-emitting material or quantum dots. The light-emitting layer 25 emits light of a predetermined luminescent color through a recombination of positive holes supplied from the anode 21 and electrons supplied from the cathode 29. The luminescent color of the display element 101 depends on the luminescent color of the light-emitting layer 25. The light-emitting layer 25 can be formed by a method such as vapor deposition, an ink-jet method, and application, for example.

The hole transport layer 23 is disposed between the anode 21 and the light-emitting layer 25 and transports positive holes from the anode 21 to the light-emitting layer 25. The hole transport layer 23 includes a hole transport material.

The hole transport material can be appropriately selected from materials generally used in the relevant field, and examples thereof include organic hole transport materials and inorganic hole transport materials. Depending on the material to be formed, the hole transport layer 23 can be formed by, for example, an application method such as an ink-jet method, a spin coating method, or a dip coating method, or by a sol-gel method, a sputtering method, a vapor deposition method, a CVD method, or the like.

The hole injection layer 22 is disposed between the anode 21 and the hole transport layer 23, and injects positive holes from the anode 21 into the hole transport layer 23. The hole injection layer 22 contains the same hole transport material as that of the hole transport layer 23. The hole transport material in the hole injection layer 22 is appropriately selected in accordance with the materials of the anode 21 and the hole transport layer 23 such that the transport efficiency of positive holes from the anode 21 to the light-emitting layer 25 is high. Note that the materials of the hole injection layer 22 and the hole transport layer 23 are preferably mutually different. Depending on the material to be formed, the hole injection layer 22 can be formed by, for example, an application method such as an ink-jet method, a spin coating method, or a dip coating method, or by a sol-gel method, a sputtering method, a vapor deposition method, a CVD method, or the like.

The electron blocking layer 24 is provided, for example, between the light-emitting layer 25 and the hole transport layer 23, and suppresses transport to the hole transport layer 23 of electrons supplied to the light-emitting layer 25 via the electron transport layer 27. As the electron blocking layer 24, an electron-blocking material that easily transports positive holes and blocks electrons is used, for example. The electron blocking material can be appropriately selected from materials generally used in the relevant field.

Depending on the material to be formed, the electron blocking layer 24 can be formed by, for example, an application method such as an ink-jet method, a spin coating method, or a dip coating method, or by a sol-gel method, a sputtering method, a vapor deposition method, a CVD method, or the like.

In the display element 101 of the present embodiment, the hole transport layer 23, the hole injection layer 22, and the electron blocking layer 24 are not essential components, and the presence or absence thereof is appropriately selected according to the performance of the display element 101.

The electron transport layer 27 is disposed between the cathode 29 and the light-emitting layer 25 and transports electrons from the cathode 29 to the light-emitting layer 25. The electron transport layer 27 includes an electron transport material. The electron transport material can be appropriately selected from materials generally used in the relevant field. Depending on the material to be formed, the electron transport layer 27 can be formed by, for example, an application method such as an ink-jet method, a spin coating method, or a dip coating method, or by a sol-gel method, a sputtering method, a vapor deposition method, a CVD method, or the like.

The electron injection layer 28 is disposed between the cathode 29 and the electron transport layer 27 and injects electrons from the cathode 29 into the electron transport layer 27. The electron injection layer 28 contains the same electron transport material as that of the electron transport layer 27. The electron transport material in the electron injection layer 28 is appropriately selected in accordance with the materials of the cathode 29 and the electron transport layer 27 such that the efficiency of electron transport from the cathode 29 to the light-emitting layer 25 is increased. The materials of the electron injection layer 28 and the electron transport layer 27 are preferably mutually different.

The hole blocking layer 26 is provided, for example, between the light-emitting layer 25 and the electron transport layer 27, and suppresses transport to the electron transport layer 27 of positive holes supplied to the light-emitting layer 25 via the hole transport layer 23. For the hole blocking layer 26, for example, a hole blocking material that easily transports electrons and blocks positive holes is used. The hole blocking material can be appropriately selected from materials generally used in the relevant field.

Depending on the material to be formed, the hole blocking layer 26 can be formed by, for example, an application method such as an ink-jet method, a spin coating method, or a dip coating method, or by a sol-gel method, a sputtering method, a vapor deposition method, a CVD method, or the like.

Note that in the display element 101 of the present embodiment, the electron transport layer 27, the electron injection layer 28, and the hole blocking layer 26 are not essential components, and the presence or absence thereof is appropriately selected according to the performance of the display element 101.

The CAP layer 3 is, for example, a filter layer that adjusts the optical path of light from the light-emitting portion 2. Preferably, the CAP layer 3 is formed from an optical material having a predetermined refractive index, and is adjusted to have a predetermined thickness. Through this, viewing angle adjustments and light extraction efficiency of the display element 101 can be improved.

The CAP layer 3 is provided so as to cover the light-emitting portion 2, for example. The CAP layer 3 may be, for example, a layered body in which a plurality of layers are laminated. The CAP layer 3 may be provided so as to cover at least the surface of the light-emitting portion 2 on the side opposite the substrate 1 side, and is more preferably formed so as to cover the entire surface of the light-emitting portion 2. Note that the light-emitting portion 2 may be sealed by, for example, the CAP layer 3 and the substrate 1. The CAP layer 3 may be formed as necessary, and may be omitted, for example.

The function layer 4 is provided so as to cover the CAP layer 3, for example. The function layer 4 is also provided so as to cover, for example, the light-emitting portion 2. That is, the function layer 4 is provided between the CAP layer 3 and the TFE layer 5. Note that the function layer 4 is described later in detail.

The TFE layer 5 is a so-called sealing layer. The TFE layer 5 suppresses, for example, the penetration of oxygen and moisture into the light-emitting portion 2. The TFE layer 5 is provided so as to cover the function layer 4, for example. The TFE layer 5 is also provided so as to cover the light-emitting portion 2. The TFE layer 5 is, for example, a layered body in which a plurality of layers are laminated. The TFE layer 5 is, for example, a layered body including at least one organic layer and at least one inorganic layer. Examples of the at least one inorganic layer include a layer made of $SiO_2$ or SiN. Note that the light-emitting portion 2 is preferably sealed by, for example, the TFE layer 5, the CAP layer 3, and the substrate 1. Further, the light-emitting portion 2 and the CAP layer 3 may be sealed by the substrate 1 and the TFE layer 5.

The function layer 4 is described in greater detail below.

The function layer 4 contains, for example, a phenylamine-based compound and a compound having a siloxane skeleton. The function layer 4 can be formed, for example, on the entire surface of the substrate 1 on which the display element 101 is provided.

Examples of the phenylamine-based compound include compounds represented by Formula (1) below.

[Chem. 1]

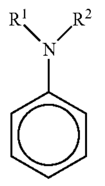

(1)

In Formula (1), $R^1$ and $R^2$ each independently denote a hydrocarbon group, or denote a hydrocarbon group in which $R^1$ and $R^2$ are linked to each other, and hydrogen atoms in $R^1$ and $R^2$ may be substituted by fluorine atoms.

Preferable examples of the phenylamine-based compound include the compound represented by Formula (2) below.

[Chem. 2]

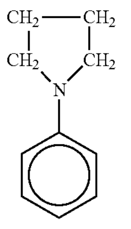

(2)

Examples of the compound having a siloxane skeleton include compounds represented by Formula (3) below.

[Chem. 3]

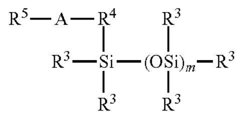

(3)

In Formula (3), each $R^3$ independently denotes a hydrocarbon group, A denotes —COO—, —OCO— or —O—, $R^4$ denotes a hydrocarbon group, $R^5$ denotes a hydrocarbon group that may have a double bond, hydrogen atoms in $R^3$, $R^4$ and $R^5$ may be substituted by fluorine atoms, and m represents an integer of 1 or greater. Also, m is preferably an integer from 5 to 40.

A preferable example of the compound having a siloxane skeleton is the compound represented by Formula (4) below.

[Chem. 4]

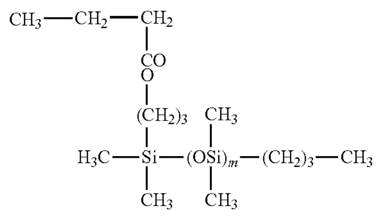

(4)

The function layer 4 is preferably, for example, a co-evaporation film obtained by co-evaporating the phenylamine-based compound and the compound having a siloxane skeleton.

As described above, since the function layer 4 contains a phenylamine-based compound and a compound having a siloxane skeleton, a decrease in luminance of the display element 101 over time can be suppressed, and the lifetime of the display element 101 can be lengthened.

The function layer 4 may also contain a polymer having a phenylamine-based skeleton and a siloxane skeleton.

Examples of the phenylamine-based skeleton include constituent units represented by Formula (5) below.

[Chem. 5]

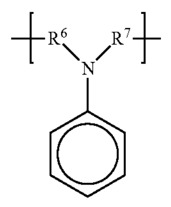

(5)

In Formula (5), $R^6$ and $R^7$ each independently denote a hydrocarbon group, or denote a hydrocarbon group in which $R^6$ and $R^7$ are linked to each other, and hydrogen atoms in $R^6$ and $R^7$ may be substituted by fluorine atoms.

A preferable example of the phenylamine-based skeleton is a constituent unit represented by Formula (6) below.

[Chem. 6]

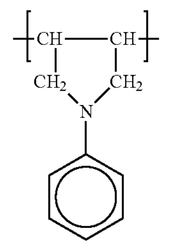

(6)

Since the polymer has the phenylamine-based skeleton, the adhesion of the function layer 4 to the organic layer can be improved.

Examples of the siloxane skeleton include constituent units represented by Formula (7) below.

[Chem. 7]

(7)

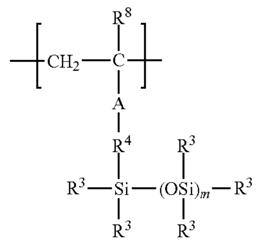

In Formula (7), each $R^3$ independently denotes a hydrocarbon group, $R^4$ denotes a hydrocarbon group, $R^8$ denotes a hydrocarbon group, hydrogen atoms in $R^3$, $R^4$ and $R^8$ may be substituted by fluorine atoms, A denotes —COO—, —OCO— or —O—, and m represents an integer of 1 or greater. Also, m is preferably an integer from 5 to 40.

A preferable example of the siloxane skeleton is a constituent unit represented by Formula (8) below.

[Chem. 8]

(8)

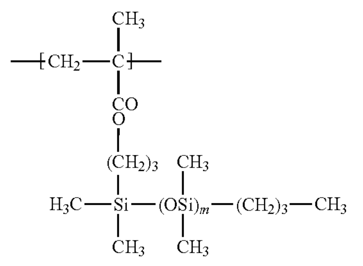

Because the polymer has the siloxane skeleton, rubber elasticity can be imparted to the function layer 4, and adhesion of the function layer 4 to the inorganic layer can be improved. Thus, for example, in the case in which the substrate 1 of the display element 101 is flexible, resistance to cracking even when the substrate 1 is bent can be achieved. In addition, the polymer has a hygroscopic group represented by A, and therefore moisture can be captured in the function layer 4, and penetration of moisture into the light-emitting portion 2 can be suppressed.

Further, the polymer preferably contains a constituent unit represented by Formula (9) below.

[Chem. 9]

(9)

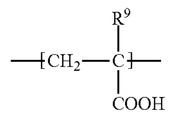

In Formula (9), $R^9$ is a hydrocarbon group.

Since the polymer has the constituent unit of Formula (9), moisture can be captured in the function layer 4, and the penetration of moisture into a layer below the function layer 4, in particular, into the light-emitting portion 2, can be suppressed.

Note that each of the hydrocarbon groups represented by $R^1$ to $R^9$ preferably has from 1 to 12 carbons, may be linear, branched, or cyclic, and may have a double bond within the group.

Further, the polymer is preferably represented by Formula (10) below.

[Chem. 10]

(10)

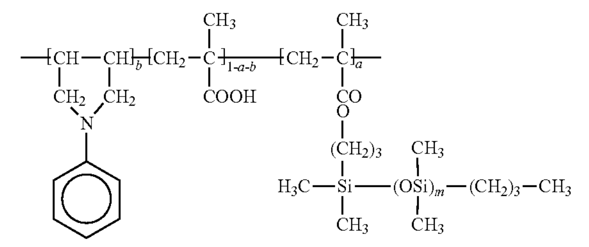

In Formula (10), a represents a number greater than 0 and equal to or less than 0.2, b represents a number greater than 0 and equal to or less than 0.5, and m represents an integer from 5 to 40. Here, a and b represent mole fractions of each constituent unit in the polymer.

In addition, for example, the mass average molecular weight of the polymer is preferably from 5000 to 300000, and more preferably from 10000 to 100000.

As described above, since the function layer 4 contains a polymer having a phenylamine-based skeleton and a siloxane skeleton, a decrease in luminance of the display element 101 can be suppressed, and the lifetime of the display element 101 can be lengthened. It is considered that this is because the function layer 4 can suppress the penetration of moisture into the light-emitting portion 2 and suppress deterioration of the display element 101.

According to the display element of the present embodiment, the function layer 4 can suppress a decrease in luminance in the display element 101 and extend the lifetime of the display element 101. It is considered that this is because the function layer 4 can, in particular, suppress the penetration of moisture into the light-emitting portion 2, improve the humidity resistance of the display element 101, and suppress the deterioration of the display element 101.

Note that although the function layer 4 is provided between the CAP layer 3 and the TFE layer 5 in the above description, the disclosure is not limited to this.

For example, the function layer 4 may be one layer of the CAP layer 3, which is a layered body. In other words, the function layer 4 may function as a CAP layer. Moreover, the CAP layer 3 may not be provided, and the function layer 4 may be configured to perform the function of the CAP layer 3. In this case, the function layer 4 is provided directly on the cathode 29. In particular, it is considered that the adhesion of the function layer 4 to the cathode 29 which is an inorganic film, is improved by including a specific polymer like that described above. At this time, the cathode 29 preferably contains, for example, Al, Mg, and/or Ag. In particular, the cathode 29 preferably contains Mg and Ag, and the mass ratio of Mg and Ag is preferably such that Ag accounts for 10% or greater. Through this, for example, the lifetime of the display element 101 can be lengthened. It is considered that this is because the function layer 4 can, in particular, suppress the penetration of moisture into the light-emitting portion 2, and thereby can improve the humidity resistance of the display element 101 and suppress deterioration of the display element 101.

Further, the function layer 4 may be, for example, one layer of the TFE layer 5, which is a layered body. The function layer 4 contains, in particular, a phenylamine-based compound or polymer having a phenylamine-based skeleton, as described above. It is considered that the function layer 4 has high adhesion to both the organic layer and the inorganic layer. Therefore, for example, it is considered that the adhesion between the function layer 4 and the CAP layer 3 is improved regardless of whether the uppermost layer in the CAP layer 3 that is in direct contact with the function layer 4 is an organic layer or an inorganic layer. On the other hand, it is considered that the adhesion between the function layer 4 and the TFE layer 5 is improved regardless of whether the lowermost layer of the TFE layer 5 that is in direct contact with the function layer 4 is an organic layer or an inorganic layer. As a result, the function layer 4 can improve the adhesion between the CAP layer 3 and the TFE layer 5. Furthermore, as described above, it is considered that by improving the adhesion of each layer, for example, the penetration of moisture into the light-emitting portion 2 can be further suppressed, and thereby the deterioration of the display element 101 can be suppressed, and the lifetime of the display element 101 can be extended.

Furthermore, the function layer 4 contains a phenylamine-based compound or a polymer having a phenylamine-based skeleton as described above, and has a charge transport property. Therefore, the function layer 4 may be, for example, a charge transport layer of the hole transport layer 23, the hole injection layer 22, or the like. In particular, when the function layer 4 is configured as a charge transport layer, for example, the penetration of moisture into a layer below the function layer 4 can be suppressed. Accordingly, it is considered that the humidity resistance of the display element 101 is improved, deterioration of the display element 101 is suppressed, and the lifetime of the display element 101 can be extended.

EXAMPLES AND COMPARATIVE EXAMPLES

Hereinafter, the display element is more specifically described.

Example 1-1

A light-emitting portion was obtained by forming, on a substrate, an anode composed of a layered body of Ag and ITO, a hole injection layer composed of 2,3,6,7,10,11-hexacyano-1,4,5,8,9,12-hexaazatriphenylene (HAT-CN), a hole transport layer composed of a triphenylamine-based material, an electron blocking layer composed of a carbazole-based material, a light-emitting layer composed of an anthracene-based light-emitting material and emitting blue light, a hole blocking layer composed of a phenylpyridine-based material, an electron transport layer composed of an oxadiazole-based material, an electron injection layer composed of LiF, and a cathode composed of Mg/Ag. Each layer was formed by a vapor deposition method. The cathode was co-evaporated such that the mass ratio of Mg and Ag was 10:1.

Further, a compound of Formula (2) above and a compound of Formula (4) above (m=20) were vapor-deposited at a molar ratio of 1:1 from above the light-emitting portion so as to cover the light-emitting portion and the substrate, and a function layer was formed.

Further, a TFE layer was formed on the function layer, the TFE layer including a SiN layer having a thickness of 0.2 μm and formed by a sputtering method, an organic layer having a thickness of 2 μm and formed by applying and photo-curing an acrylic melt, and another SiN layer having a thickness of 0.2 μm and formed by the sputtering method. Through the above, a display element was prepared. In this example, a CAP layer was not formed.

The external quantum efficiency (EQE), the chromaticity, and the lifetime represented by the time (h) until the luminance reached 90% of the initial luminance in an environment of 45° C. and 90% humidity were evaluated for the manufactured display element. The lifetime was measured in a driving test at a current of 50 $mA/cm^2$. The results are listed in Table 2.

Example 1-2

A display element was prepared in the same manner as in Example 1-1 with the exception that the Mg and Ag of the cathode in Example 1-1 were co-evaporated such that the mass ratio of Mg and Ag was 10:2.

Example 1-3

A display element was prepared in the same manner as in Example 1-1 with the exception that the Mg and Ag of the cathode in Example 1-1 were co-evaporated such that the mass ratio of Mg and Ag was 10:4.

Example 2-1

A display element was prepared in the same manner as in Example 1-1 with the exception that a CAP layer made from a phenylamine-based organic material was formed on the cathode of Example 1-1, after which a function layer composed of a polymer represented by Formula (10) (x=0.4, y=0.1, mass average molecular weight: 75000) was formed thereon. Note that N-methylpyrrolidone (NMP) of the polymer represented by Formula (10) was spin-coated to form a film, and the film was then heated and baked at 180° C. for 20 minutes to form a function layer having a thickness of 80 nm.

Example 2-2

A display element was prepared in the same manner as in Example 2-1 with the exception that the Mg and Ag of the cathode in Example 2-1 were co-evaporated such that the mass ratio of Mg and Ag was 10:2.

Example 2-3

A display element was prepared in the same manner as in Example 2-1 with the exception that the Mg and Ag of the cathode in Example 2-1 were co-evaporated such that the mass ratio of Mg and Ag was 10:4.

Example 3-1

A display element was prepared in the same manner as in Example 2 with the exception that an SiN layer of the TFE layer in Example 2, the SiN layer thereof being the SiN layer directly formed on the function layer, was omitted.

Example 3-2

A display element was prepared in the same manner as in Example 3-1 with the exception that the Mg and Ag of the cathode in Example 3-1 were co-evaporated such that the mass ratio of Mg and Ag was 10:2.

Example 3-3

A display element was prepared in the same manner as in Example 3-1 with the exception that the Mg and Ag of the cathode in Example 3-1 were co-evaporated such that the mass ratio of Mg and Ag was 10:4.

Comparative Example 1

Instead of the function layer in Example 1-1, a CAP layer including an organic layer made of a phenylamine-based organic material and an inorganic layer made of LiF was formed on the cathode by vapor deposition.

Comparative Example 2

A display element was prepared in the same manner as in Example 1-1 with the exception that the co-evaporation film of the compound of Formula (2) and the compound of Formula (4) in Example 1-1 was omitted.

The display elements of the examples and comparative examples were evaluated in the same manner as in Example 1-1. The results are listed in Table 2.

From the evaluation results of Example 1-1 and Comparative Examples 1 and 2, no difference was observed in the external quantum efficiency and chromaticity. However, the results of the lifetime under the high humidity environment indicate that the lifetime of the display element of Example 1-1 was approximately 6% longer than that of the display element of Comparative Example 1 and was longer than that of the display element of Comparative Example 2 by approximately 28% or greater. It is thought that this result was obtained due to the suppressed penetration of moisture into the light-emitting portion as a result of the function layer containing the compounds represented by the Formulas (2) and (4). Furthermore, according to Examples 1-1, 1-2, and 1-3, the lifetime is extended by increasing the ratio of Ag in the cathode. When the ratio of Ag is increased, a decrease in efficiency due to a decrease in electron injection and a decrease in lifetime due to a collapse in carrier balance occur, but the extension in lifetime surpasses these decreases. The extension in lifetime is considered to be an effect resulting from an improvement in humidity resistance due to the function layer. In particular, it is clear that the function layer particularly lengthens the lifetime when the ratio of Mg and Ag in the anode is such that the Ag accounts for 10% or greater.

In addition, from the evaluation results of Example 2-1 and Comparative Examples 1 and 2, no difference was observed in the external quantum efficiency and chromaticity. However, regarding the results of the lifetime in the high humidity environment, the lifetime of the display element of Example 2-1 was longer than that of the display element of Comparative Example 1 by approximately 25% or greater, and was longer than that of the display element of Comparative Example 2 by approximately 47% or greater. It is thought that this result was obtained due to the suppressed penetration of moisture into the light-emitting portion as a result of the function layer containing a polymer having constituent units represented by the Formulas (8) and (10). Furthermore, according to Examples 2-1, 2-2, and 2-3, regardless of a decrease in efficiency due to a decrease in electron injection and a decrease in lifetime due to a collapse in carrier balance, the lifetimes were equivalent. That is, it can be said that the function layer extended the lifetime. In particular, it is thought that the function layer particularly lengthens the lifetime when the ratio of Mg and Ag in the anode is such that the Ag accounts for 10% or greater.

Furthermore, from the evaluation results of Example 3-1 and Comparative Examples 1 and 2, no difference was observed in the external quantum efficiency and chromaticity. However, regarding the results of the lifetime in the high humidity environment, the lifetime of the display element of Example 3-1 was longer than that of the display element of Comparative Example 1 by approximately 23% or greater, and was longer than that of the display element of Comparative Example 2 by approximately 44% or greater. It is thought that this result was obtained due to the suppressed penetration of moisture into the light-emitting portion as a result of the function layer containing a polymer having constituent units represented by the Formulas (8) and (10). Furthermore, according to Examples 3-1, 3-2, and 3-3, the lifetime is extended by increasing the ratio of Ag in the cathode. When the ratio of Ag is increased, a decrease in efficiency due to a decrease in electron injection and a decrease in lifetime due to a collapse in carrier balance occur, but the extension in lifetime surpasses these decreases. The extension in lifetime is considered to be an effect resulting from an improvement in humidity resistance due to the function layer. In particular, it is clear that the function layer particularly lengthens the lifetime when the ratio of Mg and Ag in the anode is such that the Ag accounts for 10% or greater.

Furthermore, from the evaluation results of Examples 3-1, 3-2, and 3-3 and Examples 2-1, 2-2, and 2-3, it was confirmed that even when the inorganic layer (SiN layer) in the TFE layer is only one layer, sufficient external quantum efficiency, chromaticity, and extended lifetime can be achieved through the use of a function layer containing a polymer having constituent units of the Formulas (8) and (10).

The disclosure is not limited to the embodiments described above, and may be substituted with a configuration that is substantially the same as the configuration described in the embodiments described above, a configuration that achieves the same action and effect, or a configuration capable of achieving the same object.

The invention claimed is:

1. A display element comprising:

a function layer containing a phenylamine-based compound and a compound including a siloxane skeleton, wherein the phenylamine-based compound is represented by Formula (2):

(2)

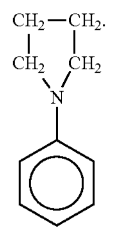

2. The display element according to claim 1, wherein the compound including a siloxane skeleton is represented by Formula (3):

(3)

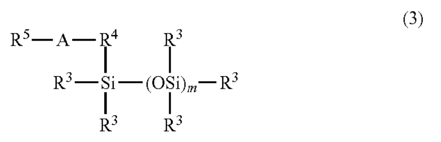

where each $R^3$ independently denotes a hydrocarbon group, A denotes —COO—, —OCO—or —O—, $R^4$ denotes a hydrocarbon group, $R^5$ denotes a hydrocarbon group that may have a double bond, hydrogen atoms in $R^3$, $R^4$ and $R^5$ may be substituted by fluorine atoms, and m represents an integer of 1 or greater.

3. The display element according to claim 2, wherein the compound including a siloxane skeleton is represented by Formula (4):

(4)

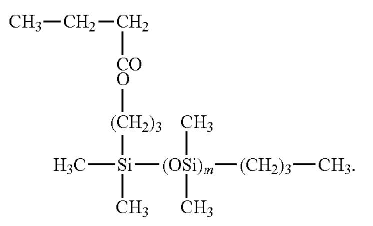

4. The display element according to claim 1, wherein the function layer is a co-evaporation film of the phenylamine-based compound and the compound including a siloxane skeleton.

5. A display element comprising:

a function layer containing a polymer including a phenylamine-based skeleton and a siloxane skeleton.

6. The display element according to claim 5, wherein the phenylamine-based skeleton includes a constituent unit represented by Formula (5):

(5)

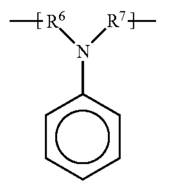

where $R^6$ and $R^7$ each independently denote a hydrocarbon group, or denote a hydrocarbon group in which $R^6$ and $R^7$ are linked to each other, and hydrogen atoms in $R^6$ and $R^7$ may be substituted by fluorine atoms.

7. The display element according to claim 6, wherein the phenylamine-based skeleton includes a constituent unit represented by Formula (6):

(6)

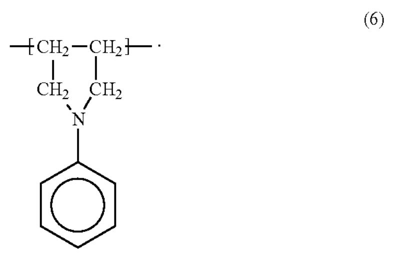

8. The display element according to claim 5, wherein the siloxane skeleton includes a constituent unit represented by Formula (7):

(7)

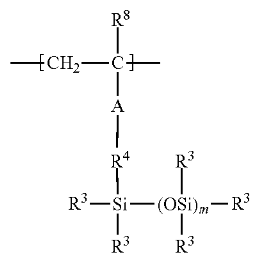

where each $R^3$ independently denotes a hydrocarbon group, $R^4$ denotes a hydrocarbon group, $R^8$ denotes a hydrocarbon group, hydrogen atoms in $R^3$, $R^4$ and $R^8$ may be substituted by fluorine atoms, A denotes —COO—, —OCO— or —O—, and m represents an integer of 1 or greater.

9. The display element according to claim 8, wherein the siloxane skeleton includes a constituent unit represented by Formula (8):

(8)

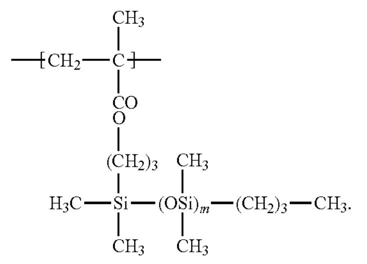

10. The display element according to claim 5, wherein the polymer includes a constituent unit represented by Formula (9):

(9)

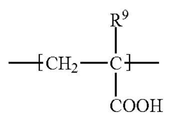

where $R^9$ is a hydrocarbon group.

11. The display element according to claim 5, wherein the polymer is represented by Formula (10):

(10)

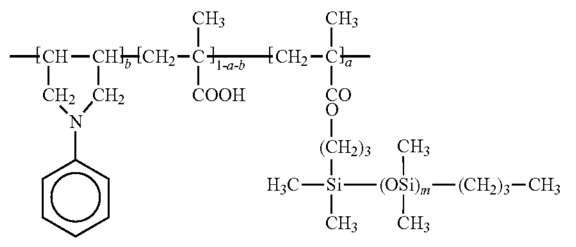

where a represents a number greater than 0 and equal to or less than 0.2, b represents a number greater than 0 and equal to or less than 0.5, and m represents an integer from 5 to 40.

12. The display element according to claim 1, further comprising a light-emitting portion formed on a substrate, wherein the function layer covers the light-emitting portion.

13. The display element according to claim 12, wherein the light-emitting portion is further covered with an inorganic layer, and the function layer is provided between the light-emitting portion and the inorganic layer.

14. The display element according to claim 13, wherein the inorganic layer includes SiN or $SiO_2$.

15. The display element according to claim 12, wherein the light-emitting portion includes a first electrode formed on the substrate, a second electrode opposing the first electrode, and a light-emitting layer provided between the first electrode and the second electrode, and the function layer contacts the second electrode.

16. The display element according to claim 12, wherein the light-emitting portion includes a first electrode formed on the substrate, a second electrode opposing the first electrode, and a light-emitting layer provided between the first electrode and the second electrode, and the function layer is provided on an organic layer provided on the second electrode.

17. A display element comprising:

a function layer containing a phenylamine-based compound and a compound including a siloxane skeleton, wherein the compound including a siloxane skeleton is represented by Formula (3):

(3)

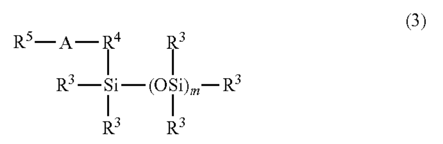

where each $R^3$ independently denotes a hydrocarbon group, A denotes —COO—, —OCO— or —O—, $R^4$ denotes a hydrocarbon group, $R^5$ denotes a hydrocarbon group that may have a double bond, hydrogen atoms in $R^3$, $R^4$ and $R^5$ may be substituted by fluorine atoms, and m represents an integer of 1 or greater.

18. The display element according to claim 17, wherein the phenylamine-based compound is represented by Formula (1):

(1)

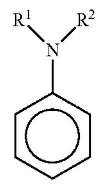

where $R^1$ and $R^2$ each independently denote a hydrocarbon group, or denote a hydrocarbon group in which $R^1$ and $R^2$ are linked to each other, and hydrogen atoms in $R^1$ and $R^2$ may be substituted by fluorine atoms.

19. The display element according to claim 17, wherein the compound including a siloxane skeleton is represented by Formula (4):

(4)

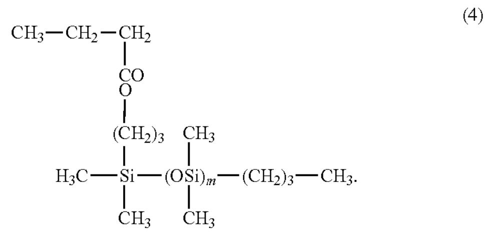

20. The display element according to claim 17, wherein the function layer is a co-evaporation film of the phenylamine-based compound and the compound including a siloxane skeleton.

* * * * *